(12) United States Patent
Warren et al.

(10) Patent No.: US 12,684,891 B2
(45) Date of Patent: Jul. 14, 2026

(54) THREE-TERMINAL INTERDIGITATED BACK CONTACT PHOTOELECTRIC DEVICE

(71) Applicant: Alliance for Energy Innovation, LLC, Golden, CO (US)

(72) Inventors: Emily Lowell Warren, Golden, CO (US); Nathan Taylor Nesbitt, Arlington, MA (US)

(73) Assignee: Alliance for Energy Innovation, LLC, Golden, CO (US)

( * ) Notice: Subject to any disclaimer, the term of this patent is extended or adjusted under 35 U.S.C. 154(b) by 0 days.

(21) Appl. No.: 18/635,438

(22) Filed: Apr. 15, 2024

(65) Prior Publication Data

US 2024/0347654 A1     Oct. 17, 2024

Related U.S. Application Data

(60) Provisional application No. 63/496,064, filed on Apr. 14, 2023.

(51) Int. Cl.
| | |
|---|---|
| *H10F 77/12* | (2025.01) |
| *H10F 77/00* | (2025.01) |
| *H10F 77/1223* | (2025.01) |
| *H10F 77/20* | (2025.01) |

(52) U.S. Cl.
CPC ....... *H10F 77/1223* (2025.01); *H10F 77/227* (2025.01); *H10F 77/935* (2025.01)

(58) Field of Classification Search
CPC .. H10F 77/1223; H10F 77/227; H10F 77/935; C25B 9/50; C25B 11/052; C25B 11/087; C25B 1/04
See application file for complete search history.

(56) References Cited

U.S. PATENT DOCUMENTS

| | | | | |
|---|---|---|---|---|
| 4,649,088 | A * | 3/1987 | Mitsui | H10F 77/315 |
| | | | | 428/218 |
| 4,916,035 | A * | 4/1990 | Yamashita | H01M 14/005 |
| | | | | 429/111 |
| 10,370,766 | B2 | 8/2019 | Segev et al. | |

(Continued)

OTHER PUBLICATIONS

Collins et al., "Utilizing three terminal IBC-based Si solar cells as a platform to study the durability of photoelectrodes for solar fuel production", Liquid Sunlight Alliance, Fall 2022 MSR, pp. 1-17.

(Continued)

*Primary Examiner* — Ida M Soward
(74) *Attorney, Agent, or Firm* — Alexandra M Hall

(57) ABSTRACT

Three-terminal (3T) photoelectrodes with cathodic protection capability are described. The 3T photoelectrodes utilize the third (i.e., the "extra") electrode to bypass the diode in a semiconductor circuit and pass current with significant reductions in corrosions or reverse bias. The 3T photoelectrodes may be operated in diode mode when exposed to illumination and switched to an ohmic mode when light is significantly reduced (i.e., in the dark) to enable cathodic protection. The 3T photocathodes may maintain photoelectrochemical (PEC) activity in methyl viologen electrolyte under light/dark cycling. The 3T photoelectrodes may enable PEC in conditions where variable illumination is a regular occurrence.

17 Claims, 5 Drawing Sheets

(56) References Cited

U.S. PATENT DOCUMENTS

| | | | |
|---|---|---|---|
| 2005/0001213 A1* | 1/2005 | Tindall | H10F 77/1223 |
| | | | 257/52 |
| 2013/0105824 A1* | 5/2013 | Paranjape | H10H 20/812 |
| | | | 257/E31.026 |
| 2021/0017653 A1* | 1/2021 | He | C25B 1/55 |
| 2022/0059719 A1* | 2/2022 | Yang | H10F 10/14 |
| 2023/0327037 A1* | 10/2023 | Li | H10F 10/19 |
| | | | 136/252 |

OTHER PUBLICATIONS

Fan et al., "n-type silicon photocathodes with AI-doped rear p+ emitter and Al2O3-coated front surface for efficient and stable H2 production", Applied Physics Letters, 2015, vol. 106, No. 21, pp. 213901-1-213901-5.

Jooss et al., "17% back contact buried contact solar cells.", Proceedings of 16th European Photovoltaic Solar Energy Conference, 2000, pp. 1124-1127.

Kim et al., "Dual mode switching of cholesteric liquid crystal device with three-terminal electrode structure," Optics Express, 2012, vol. 20, pp. 24376-24381.

Kenyon et al., "Behavior of Si Photoelectrodes under High Level Injection Conditions. 1. Steady-State Current-Voltage Properties and Quasi-Fermi Level Positions under Illumination", The Journal of Physical Chemistry B, 1997, vol. 101, No. 15, pp. 2830-2839.

Lee et al., "Sustainable production of formic acid by electrolytic reduction of gaseous carbon dioxide", Journal of Materials Chemistry A, 2015, vol. 3, No. 6, pp. 3029-3034.

Nagashima et al., "Three-terminal tandem solar cells with a back-contact type bottom cell", Conference Record of the Twenty-Eighth IEEE Photovoltaic Specialists Conference—2000 (Cat. No. 00CH37036), 2000, pp. 1193-1196.

Pornrungroj et al., "Bifunctional Perovskite-BiVO4 Tandem Devices for Uninterrupted Solar and Electrocatalytic Water Splitting Cycles", Advanced Functional Materials, 2021, vol. 31, pp. 1-9.

Segev et al., "Hybrid photoelectrochemical and photovoltaic cells for simultaneous production of chemical fuels and electrical power", Nature Materials, 2018, vol. 17, No. 12, pp. 1115-1121.

Vansant et al., "A performance comparison between GaInP-on-Si and GaAs-on-Si 3-terminal tandem solar cells", iScience, 2022, vol. 25, No. 9, pp. 1-12.

Warren et al., "A taxonomy for three-terminal tandem solar cells", ACS Energy Letters, 2020, vol. 5, No. 4, pp. 1233-1242.

Zhou et al., "A solar-charged photoelectrochemical wastewater fuel cell for efficient and sustainable hydrogen production", Journal of Materials Chemistry A, 2017, vol. 5, No. 48, pp. 25450-25459.

* cited by examiner (a)

(b)

THREE-TERMINAL INTERDIGITATED BACK CONTACT PHOTOELECTRIC DEVICE

CROSS-REFERENCE TO RELATED APPLICATIONS

This application claims priority to U.S. Provisional Patent Application No. 63/496,064 filed on Apr. 14, 2023, the contents of which are incorporated herein by reference in their entirety.

CONTRACTUAL ORIGIN

This invention was made with United States government support under Contract No. DE-AC36-08GO28308 awarded by the U.S. Department of Energy. The United States government has certain rights in this invention.

BACKGROUND

Photoelectrochemical (PEC) fuel forming devices (typically either $CO_2$ reduction or water-splitting to produce $H_2$) are generally designed so that a semiconductor surface is in contact with a catalyst and electrolyte that contains the feedstock. Stability of the semiconductor material from corrosion and/or oxidation is a known problem with these devices, limiting the durability of these devices to a few hundred hours (much lower than the decades of performance that can be achieved with photovoltaic systems using the same semiconductors). Thus, there remains a need for durable PEC devices that can operate long-term with minimal corrosion.

SUMMARY

An aspect of the present disclosure is photoelectric device including a wafer having a first side and a second side, a first n-type contact located on the first side, a second n-type contact located on the second side, and a p-type contact located on the second side, in which the p-type contact and the second n-type contact are arranged in parallel. In some embodiments, the wafer includes a crystalline Czochralski-grown n-type silicon (Si) wafer. In some embodiments, the first n-type contact includes a diffused n+-Si front surface field. In some embodiments, the second n-type contact includes a degeneratively doped Si region. In some embodiments, the p-type contact includes a degeneratively doped Si region. In some embodiments, the conductive layer includes a n-type Si region. In some embodiments, the second side includes a Si oxide, a Si nitride, and a conductive metal. In some embodiments, the conductive metal includes at least one of silver, copper, or gold.

An aspect of the present disclosure is a method of operating a photoelectric device, the method including operating the photoelectric device in a diode mode, and operating the photoelectric device in an ohmic mode, in which in the ohmic mode a current does not cross a diode. In some embodiments, the photoelectric device includes a wafer having a first side and a second side, a first n-type contact located on the first side, a second n-type contact located on the second side, and a p-type contact located on the second side, in which the p-type contact and the second n-type contact are arranged in parallel. In some embodiments, the diode mode includes connecting the first n-type contact and the p-type contact. In some embodiments, the ohmic mode includes connecting the first n-type contact with the second n-type contact. In some embodiments, the diode includes a semiconductor layer. In some embodiments, the wafer includes a crystalline Czochralski-grown n-type silicon (Si) wafer. In some embodiments, the first n-type contact includes a diffused n+-Si front surface field. In some embodiments, the second n-type contact includes a degeneratively doped Si region. In some embodiments, the p-type contact includes a degeneratively doped Si region. In some embodiments, the conductive layer includes a n-type Si region. In some embodiments, the second side includes a Si oxide, a Si nitride, and a conductive metal. In some embodiments, the conductive metal includes at least one of silver, copper, or gold.

BRIEF DESCRIPTION OF THE DRAWINGS

Some embodiments of the present disclosure are illustrated in the referenced figures of the drawings. It is intended that the embodiments and figures disclosed herein are to be considered illustrative rather than limiting.

DETAILED DESCRIPTION

Figure 1:
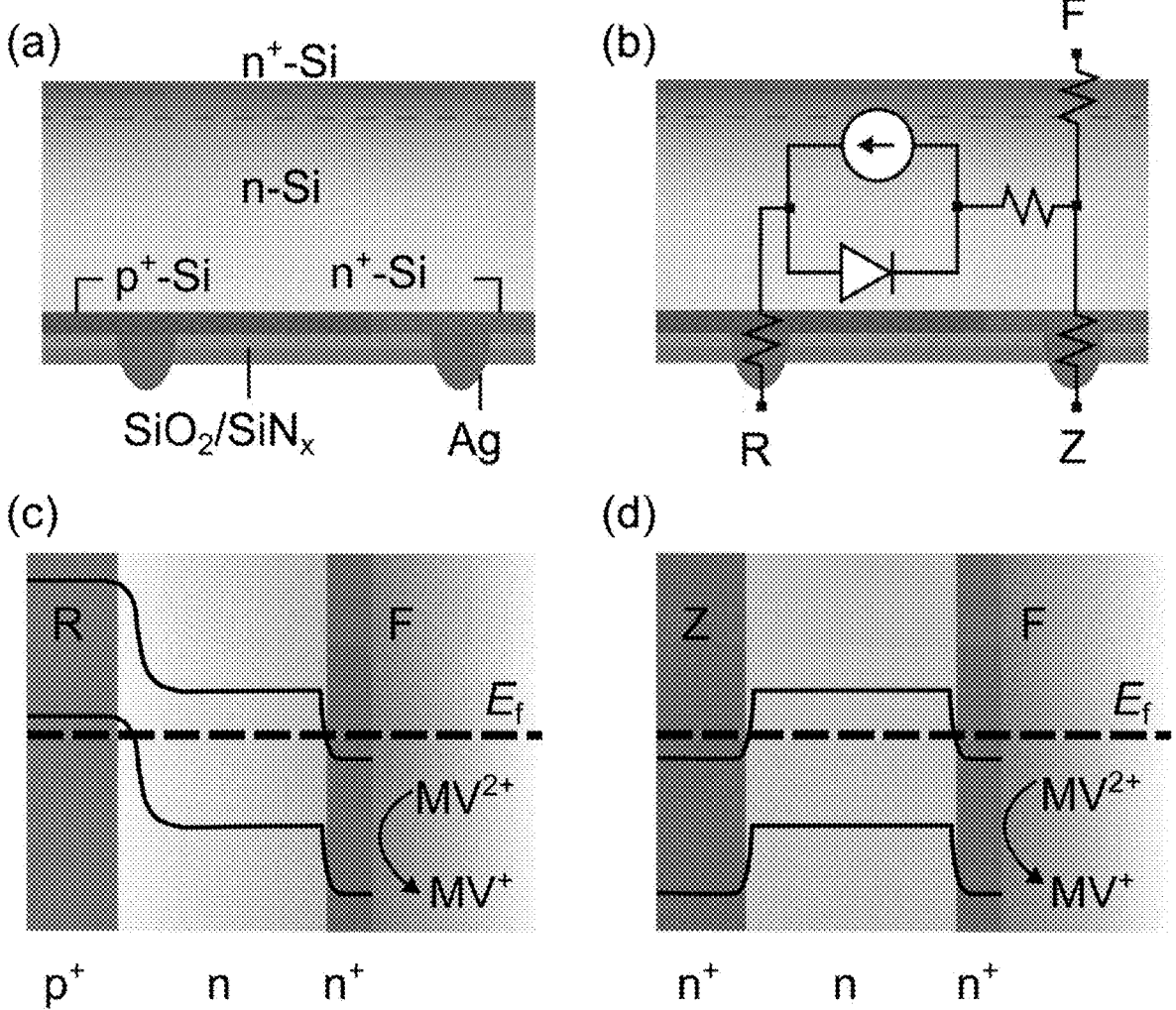
FIG. 1 illustrates cross sectional schematics of three terminal (3T) devices showing (a) doping, passivation layers, and contacts and (b) equivalent electrical circuit, showing how FR and RZ pass current through a diode, while FZ measurements only have resistive losses, (c) one-dimensional band bending at approximately equilibrium between the F ($n^+$ front) and R ($p^+$ back) contacts, and (d) one-dimensional band bending at approximately equilibrium between the F ($n^+$ front) and Z ($n^+$ back) contacts, according to some aspects of the present disclosure.

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Among other things, the present disclosure relates to three-terminal (3T) photoelectrodes with cathodic protection capability. As described herein, the 3T photoelectrodes utilize the third (i.e., the "extra") electrode to bypass the diode in a semiconductor circuit and pass current with significant reductions in corrosions or reverse bias. The 3T photoelectrodes may be operated in diode mode when exposed to illumination and switched to an ohmic mode when light is significantly reduced (i.e., in the dark) to enable cathodic protection. As described herein, the 3T photocathodes may maintain photoelectrochemical (PEC) activity in methyl viologen electrolyte under light/dark cycling. The 3T photoelectrodes described herein may enable PEC in conditions where variable illumination is a regular occurrence.

Many photoelectrode assemblies degrade when subjected to light/dark cycling due to deleterious reactions in the dark (e.g., corrosion, passivation, poisoning, etc.). Attempts to maintain favorable currents or potentials in the dark often lead to degradation or breakdown of the semiconductor material. The 3T photoelectrodes described herein may significantly reduce these deleterious reactions, enabling the use of solar cells for solar fuels production.

The 3T ZEBRA solar cells were fabricated out of crystalline n-type Czochralski-grown (CZ) Si wafers with degenerately doped p-type ($p^+$) and n-type ($n^+$) Si regions formed by laser ablation and low temperature diffusion. The $p^+$-type and $n^+$-type back contacts are referred to as R and Z, respectively (See FIG. 1). The ZEBRA metallization scheme uses isolation paste in select areas between fingers and busbars, allowing flexible positioning of the busbars with respect to screen-printed Ag fingers. In the Gen 1 ZEBRA cells used in this work, the front of the cells had a diffused $n^+$-Si front surface field (panel (a) of FIG. 1). The front, electrochemical contact is denoted as F. A simplified equivalent circuit of the 3T device is shown in panel (b) of FIG. 1. As used herein, "degeneratively doped" refers to a semiconductor that is so heavily doped so as to start acting more like a metal than a traditional semiconductor. This may be when dopant atoms are added on the order of approximately one per approximately ten thousand atoms.

A cross-section schematic of a 3T Si solar cell as described in some embodiments herein is shown in panel (a) of FIG. 1. The bulk of the 3T device is crystalline n-type Si. On the back are degenerately doped n-type ($n^+$-Si) and p-type ($p^+$-Si) contacts connected to the silver (Ag) back contact. At the solid-liquid interface there is a thin conductive n+-Si layer (see panel (a) of FIG. 1). Semiconductors act as one-way current switches in a circuit and trying to pass current in the opposite direction may damage the cell, but the extra electrical contact on the backside of the 3T solar cell is constructed in a way to bypass the diode circuit (when operated in FZ/ohmic mode). This may allow for the passing of current without going through the diode and enables cathodic protection within the 3T cells. The 3T Si may be operated in three modes varying by where the electrode is contacted, which may be referred to as FR, FZ, and RZ. Both FR and FZ modes have a front contact with the methyl viologen (MV) solution, while the RZ mode does not transfer charge carriers with solution. As shown in panel (b) of FIG. 1, both FR and RZ pass current through a diode, while FZ measurements have resistive losses. The functionality of the modes is comparative with 2T analogues. A p-Si photocathode is the analogue for FR, a $n^+$Si cathode is the analogue for FZ, and Si solar cell is the analogue for RZ.

Before the 3T Si can be used as a photoelectrode, the native oxide layer on the electrochemical (front $n^+$ contact) surface may be removed via HF etching. Then, the 3T Si can be operated in three modes in solution, depending on which contacts are connected: FR, FZ, or RZ. When the device is operated as a photoelectrode, both FR and FZ modes have a wet, electrochemical contact. In RZ mode, the device operates like a traditional IBC solar cell and does not transfer charge carriers with solution. When configured for FR mode (also known as diode mode) (operating under illumination), qualitative band bending diagrams suggest that after equilibrium is established electrons are directed towards the semiconductor-solution interface and holes are collected at the $p^+$ back contact (panel (c) of FIG. 1). Band bending diagrams for FZ mode (also known as ohmic mode) (operating in the dark) suggest no large energy barrier for electrons at the solution interface or $n^+$ back contact (panel (d) of FIG. 1).

Figure 2:
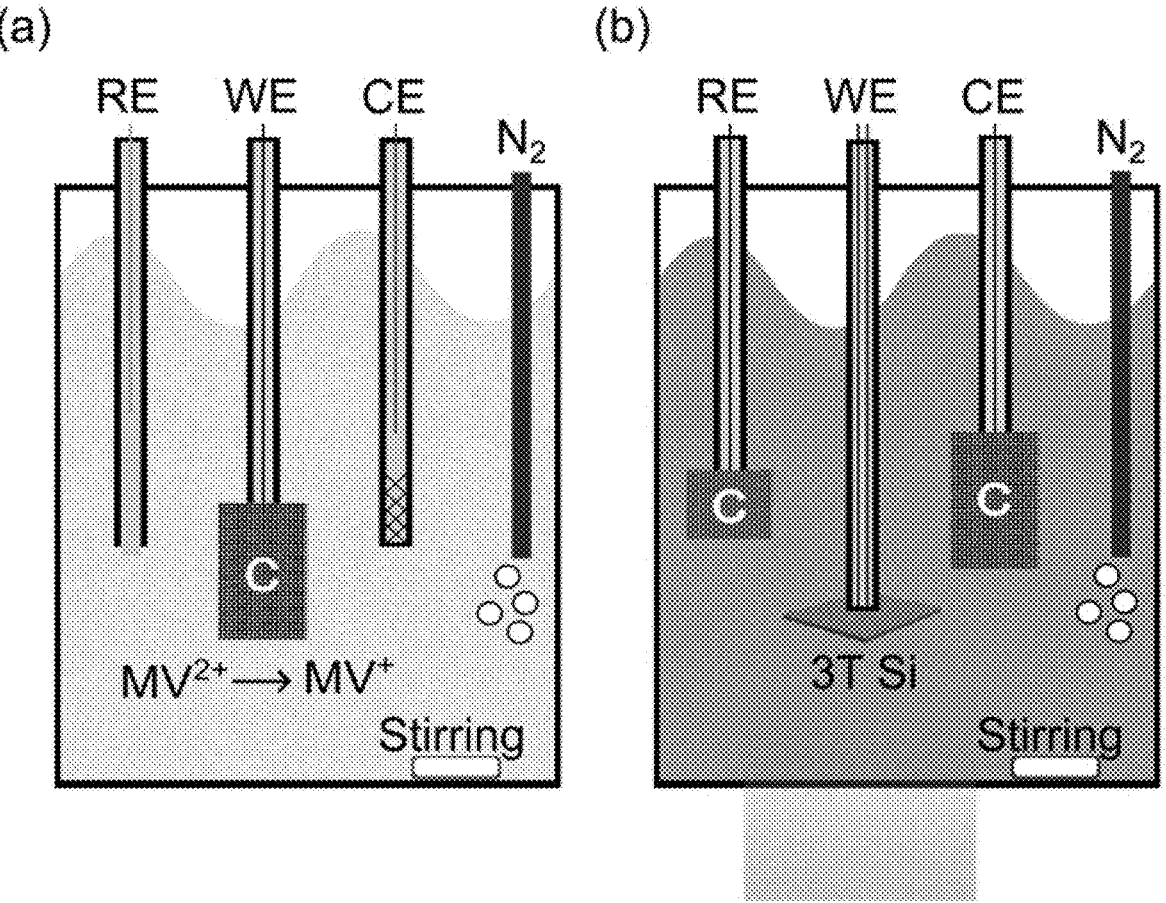
FIG. 2 illustrates schematics of some embodiments of the present disclosure for (a) the in-situ pre-electrolysis of $MV^{2+}$ to $MV^+$, and (b) photoelectrochemical/electrochemical characterization of 3T Si with respect to the $MV^{2+}/MV^+$ solution potential using a carbon cloth electrode (C), according to some aspects of the present disclosure.

A schematic for the photoelectrochemical characterization of the 3T photoelectrodes is shown in FIG. 2. Specifically, FIG. 2 illustrates schematics of some embodiments of the present disclosure for (a) the in-situ pre-electrolysis of $MV^{2+}$ to $MV^+$, and (b) photoelectrochemical/electrochemical characterization of 3T Si with respect to the $MV^{2+}/MV^+$ solution potential using a carbon cloth electrode (C), according to some aspects of the present disclosure.

To extract stable photoelectrochemical measurements both species of the redox couple should be present in solution. Pre-electrolysis was performed in-situ to reduce the $MV^{2+}$ to $MV^+$ prior to the characterization of the Si. The reduced species is generated by using a large carbon cloth electrode as a working electrode held at approximately −0.54 V vs. Ag/AgCl until the desired solution potential of approximately −0.5 V vs. Ag/AgCl was reached as determined relative to the Ag/AgCl reference and an additional small carbon cloth reference (see panel (a) of FIG. 2). The $MV^+$ species absorbs strongly in the visible light region, but this can be minimized when the potential of the solution is approximately −0.5 V vs. Ag/AgCl. Oxygen will convert the $MV^+$ back into $MV^{2+}$. The photoelectrochemical setup is frequently purged with nitrogen gas ($N_2$) and the counter electrode is behind a ground glass frit to minimize the oxygen present in solution and maintain the solution potential. The difficulties of using MV here were offset by being able to photoelectrochemically characterize the 3T Si without the addition of a catalyst, allowing the light absorption and electrocatalytic components of the PEC system to be decoupled.

Schematics of the exemplary electrochemical characterization configurations for this present disclosure are shown in FIG. 2. A $MV^{2+/+}$ redox couple in an aqueous solution (50 mM $MV^{2+}$, 0.1 M potassium hydrogen phthalate, 0.5 M $K_2SO_4$, pH 3.5) was used to assess the PEC performance of bare Si. Si is a substantially poor electrocatalyst for $H_2$ generation or $CO_2$ reduction, so it either may utilize a catalyst or be characterized with a fast, outer-sphere redox couple. The $MV^{2+/+}$ redox couple is used to demonstrate cathodic protection on the bare semiconductor architecture. To build up the concentration of $MV^+$, pre-electrolysis was performed in situ to reduce $MV^{2+}$ to $MV^+$ immediately prior to the characterization of the device (panel (a) of FIG. 2). This may be used to fix the solution potential ($E_{soln}$) for extracting stable PEC measurements since both species should be present in solution for the Nernstian potential to be well-defined. Pre-electrolysis was terminated once $E_{soln}$ reached approximately −0.5 V vs. Ag/AgCl with a concentration of less than 1 mM of $MV^+$. This potential provided enough $MV^+$ to conduct tests while limiting the light loss through the solution, as $MV^+$ is dark blue and absorbs light that could reach the photoelectrode. Because oxygen can convert the $MV^+$ back into $MV^{2+}$ and change the solution potential during operation, the PEC cell was substantially continually purged with wet $N_2$. During pre-electrolysis the Pt counter electrode was also behind a ground glass frit to minimize the oxygen present in solution. While the $MV^{2+/+}$ redox system has some complexities, it provides a valuable way to electrochemically characterize the 3T Si without the addition of a catalyst, allowing us to completely decouple the light absorption and electrocatalytic components of the PEC system. Obviously, for real-world applications a catalyst would be added to Si to facilitate electrocatalysis. However, durability measurements would then characterize the Si and the catalyst. It is important to first establish the bare 3T Si photocathode durability before adding additional components.

After pre-electrolysis, the cell was reconfigured for PEC measurements of the 3T Si working electrode (panel (b) of FIG. 2). During PEC characterization and durability tests, the working electrode was the 3T device and both the counter and reference electrodes were carbon cloth. A carbon-cloth reference was used as a pseudo reference, making the reference electrode potential dependent on the concentrations of $MV^{2+}$ and $MV^+$. If too much of the $MV^+$ species is produced, the solution will strongly absorb visible light and $E_{soln}$ will be more negative. Small fluctuations from $E_{soln}$ of approximately −0.5 V vs. Ag/AgCl can shift the current density of the 3T device by up to approximately 1.5 mA cm$^{-2}$.

Figure 3:
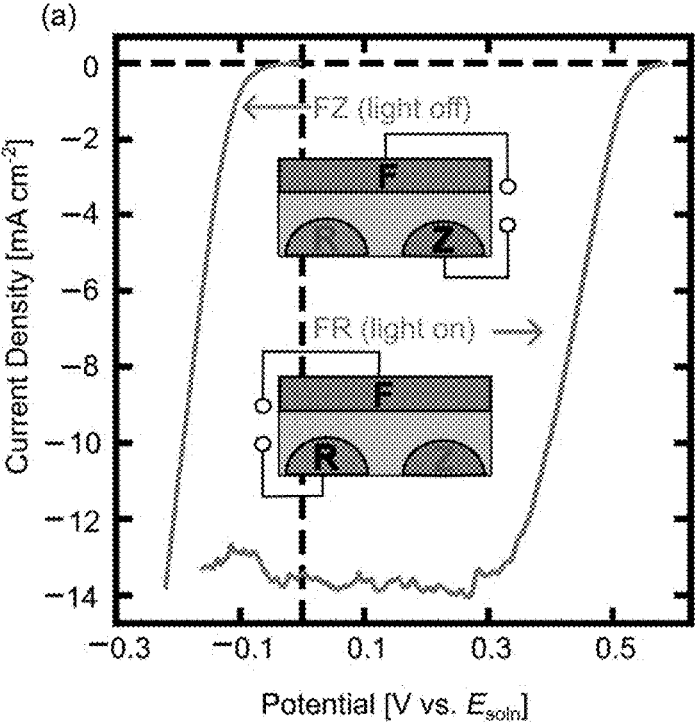
FIG. 3 illustrates cyclic voltammograms of the three operating modes of 3T (a) FR mode CV and dark FZ CV vs $E_{soln}$ immersed in $MV^{2+/+}$ solution, (b) RZ mode CVs for an electrode measured in air and $MV^{2+/+}$ electrolyte ($E_{soln}$ is approximately—0.5 V vs. Ag/AgCl), according to some aspects of the present disclosure.
Figure 3:
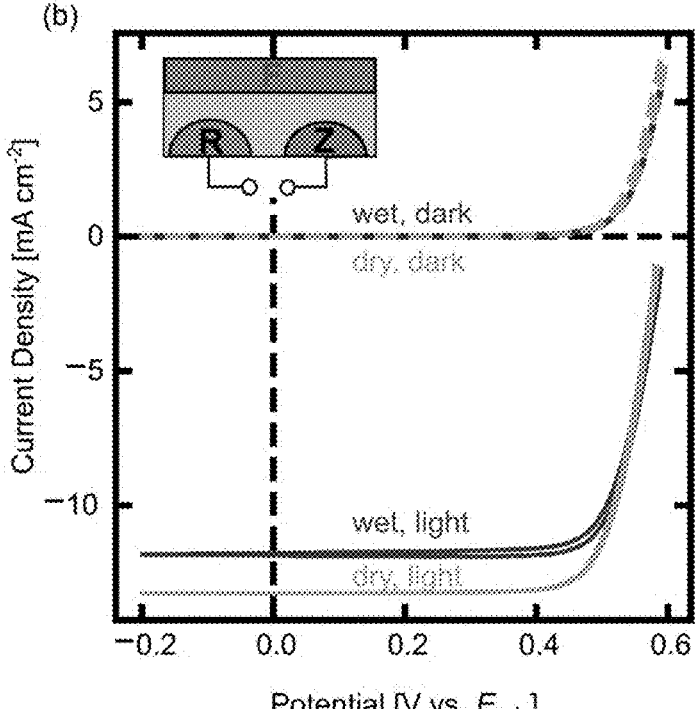

To characterize the behavior of 3T Si photocathodes, cyclic voltammetry (CV) was used to look at the energy conversion behavior of each 3T mode (FIG. 3). The cathodic sweep of CVs in FR mode (i.e., diode mode) under illumination and FZ mode (i.e., ohmic mode) in the dark are shown in panel (a) of FIG. 3. The functionalities of the 3T Si modes are comparable to the familiar 2T photocathode architectures. In FR mode, the photoelectrochemical behavior shows a positive voltage onset and a light-limited cathodic current (panel (a) of FIG. 3). This is similar behavior to what is observed for a standard 2T photocathode device (e.g., p-Si). In FZ mode the device does not form a rectifying junction with the electrolyte and can pass cathodic current freely (similar to a heavily doped, e.g. n$^+$-Si dark cathode) (panel (a) of FIG. 3). However, these modes should not be considered as simple 2T analogues. Rather, relating the behavior of each operational mode of the 3T to their respective 2T helps predict performance and compare the 3T with previous measurements of 2T devices. While in FR mode, the illuminated open circuit potential ($V_{OC,FR}$) was approximately 0.55 V vs. $E_{soln}$, and the short circuit current density ($J_{SC,FR}$) of the 3T Si in FR mode was approximately −13.7 mA cm$^{-2}$. When operating FZ mode in the dark, the reduction of $MV^{2+}$ begins at 0 V vs $E_{soln}$ and at approximately −0.2 V vs $E_{soln}$ the current passed was equivalent to $J_{SC,FR}$ under illumination. As expected from dark, dry measurements in FZ mode at small, applied potentials, the 3T Si photocathode can pass the same (or more) current density as in FR mode under illumination, enabling the same reaction to be driven in the dark and in the light.

To evaluate photoelectrochemical durability on 3T Si, the j-E relationship was determined from cyclic voltammetry (see FIG. 3). The j-E relationship of 2T analogues was consistent with previous measurements of n$^+$-Si and p-Si in methyl viologen. It was important to monitor the incident illumination intensity in the methyl viologen solution, since the reduced species of MV is a vivid blue-purple color and absorbs some of the incident light. Usually this includes a carefully calibrated photodiode closely aligned with the working electrode, but the 3T construction can act as an in-situ photodiode in RZ mode. For a given test setup, the incident illumination on the actual device to be tested can be determined in the dry and wet conditions. While in RZ mode the Si cell does not have a solution/electrochemical contact and operates similar to a Si photodiode. Even though the 3T Si is not calibrated to 1-sun like an actual photodiode, the RZ measurements reveal the light incident on the actual sample and substantially removes a test constraint of requiring space for a photodiode. In addition, when there is sufficient mass transport, photocurrent losses due to solution absorption and kinetic losses with wet/dry RZ measurements can be estimated. The j-E relationship of dry RZ measurements reveals the maximum photocurrent of the cell under investigation. The wet RZ measurements are performed after the pre-electrolysis of the MV solution. The maximum photocurrent obtainable in the reduced solution was in the range of approximately 5 to approximately 10 mA cm$^{-2}$ less than the dry measurement (panel (b) of FIG. 3). The contour plots show the effect of the FR and FZ voltage on the FR (panel (a) of FIG. 4) and FZ (panel (b) of FIG. 4) currents. For FIG. 3 for the wet measurements, the two back contacts of the 3T were contacted and the solution was not part of the circuit.

It is important to monitor the illumination intensity in the $MV^{2+/+}$ solution, since the reduced $MV^+$ absorbs some of the incident light. Usually this includes monitoring with a carefully calibrated photodiode closely aligned with the working electrode, but the 3T photoelectrode construction demonstrated here can act as an in-situ photodiode in RZ mode, as no current is passed through the electrochemical cell, similar to the operation of a normal IBC cell (panel (b) of FIG. 3). The J-V performance of dry RZ measurements reveals the maximum photocurrent of the device under investigation. The wet RZ measurements were performed after the pre-electrolysis of the $MV^{2+/+}$ solution. The maximum photocurrent obtained in RZ mode with the reduced solution was approximately 1.5 mA $cm^{-2}$ less than the dry measurement (panel (b) of FIG. 3). The dry cell setup and the $MV^{2+}$ (not reduced) solution do not absorb significantly in the visible range. However, at $E_{soln}$ of approximately −0.5 V vs Ag/AgCl, a broad absorption peak centered at approximately 600 nm appears with a maximum absorbance of approximately 0.5. In RZ mode, no charges pass to solution, therefore the reduction in current density is from the absorption of light by the $MV^+$ species in solution.

Figure 4:
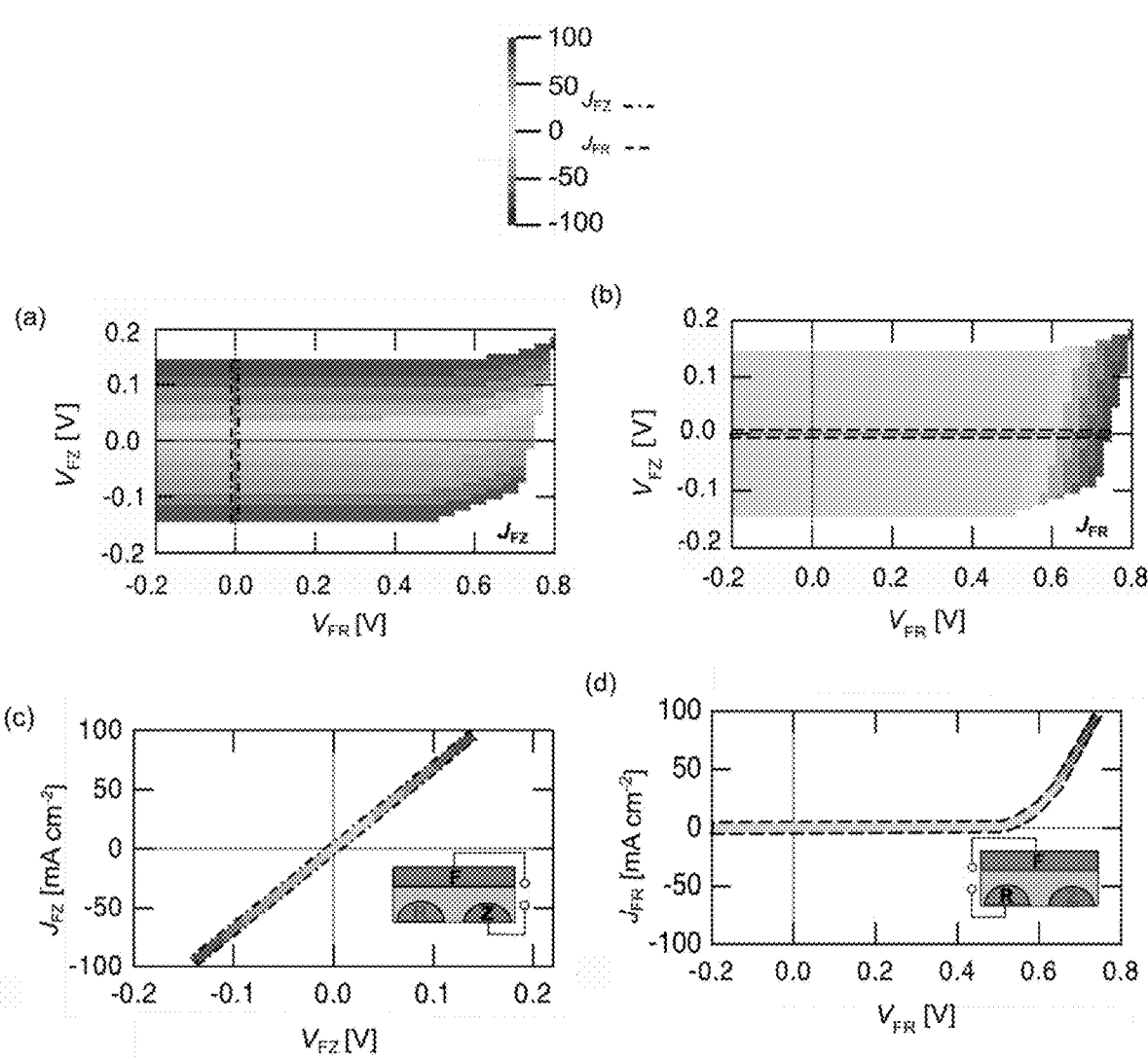
FIG. 4 illustrates electrical characterization of a nulBC-3T Si solar cell in the dark in which the front of the device (F) was contacted with an evaporated Ag grid as described herein, (a) contour plot of $J_{FR}$ as a function of $V_{FZ}$ and $V_{FR}$, (b) $J_{FR}$-$V_{FR}$ data corresponding to $V_{FZ}$=0 (dashed line in the $J_{FR}$ contour plot), (c) contour plot of $J_{FZ}$ as a function of $V_{FZ}$ and $V_{FR}$, and (d) $J_{FZ}$-$V_{FZ}$ data corresponding to $V_{FR}$=0 (dashed line in the $J_{FZ}$ contour plot), according to some aspects of the present disclosure.

Unlike a traditional 2T PV device, where there is only one independent electrical variable (current, J or voltage, V), a 3T device has two independent electrical variables. For a 3T device, the full electrical performance cannot be described by a simple J-V curve unless one of the contacts is not connected (FIG. 2). A 3T PV device with a metallized front grid (F contact) was measured in the dark to show the different performance that is possible in FR and FZ modes. Panel (a) of FIG. 4 shows a contour plot of the FR current (JFR) as a function of FR voltage (VFR) and FZ voltage (VFZ), while panel (b) of FIG. 4 shows the JFR vs VFR when VFZ was approximately 0 V, (indicated by the dashed line in panel (a) OF FIG. 4). These figures show that similar to a 2T device, in FR mode, a 3T device does not pass significant cathodic current in the dark under forward bias, regardless of the FZ voltage applied to the cell. Panel (c) of FIG. 4 shows a contour plot of the FZ current (JFZ) as a function of VFR and VFZ in the dark, while panel (d) of FIG. 4 shows the JFZ vs VFZ when VFR=0 V (indicated by the dashed line in panel (c) of FIG. 4). As expected from the band diagram in FIG. 1, the data is linear, showing typical resistive behavior between the two n+ contacts. This means in FZ mode, a 3T device can pass cathodic current in the dark, limited only by resistive losses in the semiconductor.

Figure 5:
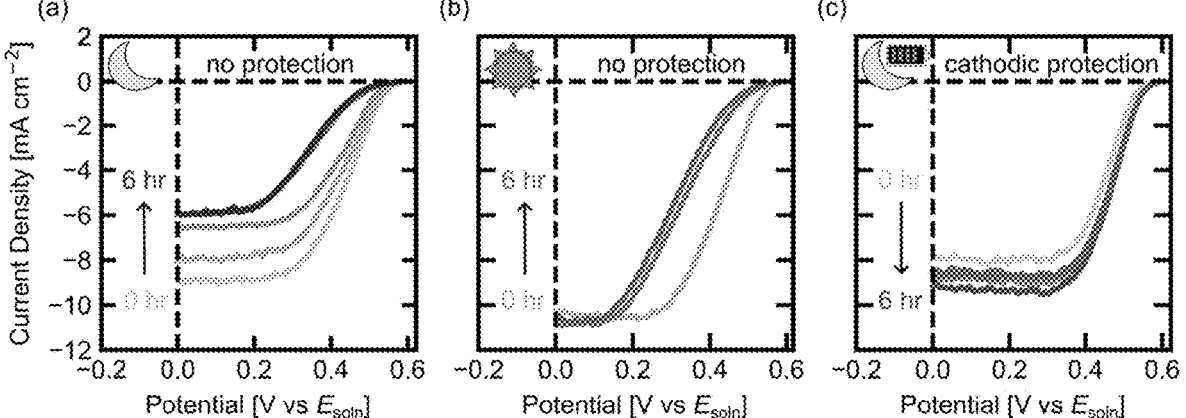
FIG. 5 illustrates FR mode (i.e., diode mode) light CVs under simulated AM1.5G illumination (a) were taken approximately each hour in between steady state dark operation holding an electrode in FZ mode open circuit ($J_{FZ}$=0), (b) taken approximately three hours in between continuous illumination in between open circuit ($J_{FZ}$=0) illuminated operation, and (c) taken approximately each hour in between steady state dark operation holding an electrode in FZ mode at approximately −0.16 V vs. $E_{soln}$, according to some aspects of the present disclosure.

To determine the effect of cathodic protection on the 3T photoelectrodes, durability tests were performed (FIG. 5). First, changes to the current/voltage behavior of the 3T photoelectrode were examined without cathodic protection. The 3T Si electrode was left in the dark in the previously described $MV^{2+/+}$ electrolyte at open circuit potential for hour-long increments. After about each hour, a CV in FR mode was measured under illumination; this was repeated for approximately 6 hours. The cathodic sweeps of the FR CVs are shown in panel (a) of FIG. 5. The initial CV had a $J_{SC,FR}$ of approximately −9.0 mA $cm^{-2}$. The $J_{SC,FR}$ decreased each hour until about hour 5, where it plateaued at approximately −6.0 mA $cm^{-2}$. After the final CV, the 3T electrode was re-etched in hydrofluoric acid. The subsequent CV regained the original shape, although the $J_{SC,FR}$ remained reduced at approximately −6.0 mA $cm^{-2}$. This suggests that some of the degradation after about 6 hours was from an oxide layer forming on the surface. This test was repeated for a p-Si photocathode, where the $V_{OC}$ decreased by more than approximately 100 mV in about 24 hours. This suggests that unprotected 2T and 3T Si photocathodes have losses in activity over prolonged exposure to aqueous solution in the dark.

Next, a durability test under illumination was performed to characterize the performance of 3T Si in solution without any cathodic protection. The 3T Si electrode was left in the light in the $MV^{2+/+}$ electrolyte at open circuit potential for three-hour-long increments. After approximately 3 hours and approximately 6 hours, illuminated CVs were measured (panel (b) of FIG. 5). The initial CV had a $J_{SC,FR}$ of approximately −10.2 mA $cm^{-2}$. The $J_{SC,FR}$ remained substantially constant throughout the approximately 6-hour test. However, resistive losses in the shape of the CV were apparent after both about 3 hours and about 6 hours, indicating loss in performance, but not as drastic as the 3T Si photocathode in the dark for about 6 hr.

Then, cathodic protection applied through the extra electrical contact (Z) to the 3T Si photoelectrode in the dark was examined. In this test, rather than letting the photoelectrode sit at open circuit in the dark, the electrode was held at a substantially constant potential in FZ mode (approximately −0.16 V vs $E_{soln}$) for 6 approximately one-hour intervals. This FZ voltage was chosen because it produced the same current in the dark as the maximum power point current under illumination in FZ mode. At the approximate end of each hour in the dark, FR mode (i.e., diode mode) and RZ mode (i.e., traditional mode) CVs were recorded under illumination and the cathodic FR sweeps of the CVs are shown in panel (c) of FIG. 5. Initially, the FR CV had slightly lower activity compared to the previous dark no cathodic protection test, but the activity improved in the subsequent, hourly CVs. However, unlike the unprotected dark test, every subsequent CV had similar $J_{SC,FR}$, with an average of approximately −8.5±0.5 mA $cm^{-2}$ (panel (c) of FIG. 5) and substantially no apparent resistive losses in the CV shape. Changes in light intensity through the solution caused the $J_{SC,FR}$ in each CV to vary by ~±1 mA $cm^{-2}$ as observed in the RZ measurements. As the test progressed, more of the light absorbing $MV^+$ species was produced, which made $E_{soln}$ more negative, increasing the light absorbed by the solution, and decreasing $J_{FR}$. Thus, the change in $J_{SC,FR}$ in the CV hour-to-hour is mostly due to the small variations in solution potential.

The applied cathodic potential was recorded with chronoamperometry (CA) to monitor the current densities during each 1-hr period in the dark. The initial current density was −10.5 mA $cm^{-2}$, which remained steady over the first hour in the dark. The second hour started at a lower current density of −9.5 mA $cm^{-2}$ and increased slightly over the hour to −10.0 mA $cm^{-2}$. The steady state current densities achieved in the third hour was again −10.5 mA $cm^{-2}$ and over the next few hours there was a current loss of ~1.5 mA $cm^{-2}$ likely due to the changing solution potential over the hour.

Scanning electron microscopy (SEM) micrographs and energy-dispersive X-ray spectroscopy (EDS) data was taken on a cathodically protected 3T Si electrode after the durability testing. Salt crystals were observed on the electrode surface. EDS showed C, O, Cl, Si, S, and K all present on the sample. An oxide layer had likely grown as the sample was transferred to the SEM chamber. The Cl, K, S, and C are concentrated on the crystalline salt feature. The additional losses in performance in both cases could have been to the salt formation on the surface lowering active area and therefore lowering the current density.

To understand the difference between cathodic protection in FR mode and FZ mode, a CV was taken, and a durability test was performed. First, a cathodic FR sweep of the 3T Si photoelectrode in the dark was recorded from approximately 0.6 V vs $E_{soln}$ to approximately −4.0 V vs $E_{soln}$. In the dark in FR mode, it took an applied voltage of approximately −3.0 V vs $E_{soln}$ to pass approximately 1 mA cm$^{-2}$ of cathodic current. To pass currents higher than approximately −1 mA cm$^{-2}$ in FR mode in the dark, the photoelectrode may require operating at significantly higher voltages. To protect the 3T Si electrode in the dark in FR mode the electrode was held at the current passed at the maximum power point from the light CV (approximately −8.2 mA cm$^{-2}$). It required approximately −4.5 V vs $E_{soln}$ to maintain a substantially constant current of approximately −8.2 mA cm$^{-2}$. Although the large negative voltages were able to maintain CV performance in FR mode, as apparent in the initial CV and CV after FR cathodic protection, that large voltage required to protect the 3T Si photocathode in the dark in FR mode may be impractical for any solar fuel system.

Without cathodic protection, the 3T Si photoelectrode had over 33% loss in photocurrent after 6 hours in solution in the dark. The decreasing current density and change in shape of the J-V curve (panel (a) of FIG. 5) is indicative of resistive loss, which could partially come from the formation of a SiO$_x$ layer at the electrode surface and salt condensing out from solution. Additionally, in the light at open circuit potential (panel (b) of FIG. 5), the change of the J-V curve suggests resistive losses after 6 hrs. However, when a protective cathodic potential is applied in the same test configuration (panel (c) of FIG. 5), the maximum photocurrent density remains consistent, with small variations due to shifts in the $E_{soln}$ changing the amount of light reaching the photoelectrode. This test suggests that cathodic potential applied in the FZ mode protects the PEC system from degradation in the dark.

Cyclic voltammograms (CV) were performed in an aqueous solution of methyl viologen. The 3T photoelectrodes were compared to traditional two terminal (2T) photoelectrodes. Short-term durability tests were performed to understand the difference in performance between the 2T cell and 3T cell after approximately 1 hour of illumination and approximately 1 hour of no illumination. All CVs were taken with the photoelectrode configured for FR mode. CVs after running the photoelectrode in FR mode (i.e., diode mode) in both the light and dark can be seen in FIG. 5. FIG. 5 has substantially the same CV of FR in the light but during the approximately 1 hour of no illumination the configuration was switched to FZ mode (i.e., ohmic mode) and a potential was applied. A cathodic current was observed.

As described herein, the 3T architecture provides a pathway to protect the photocathode in solution in the dark. After approximately 3 hours in solution in the dark with its cathodic protection the 3T photoelectrode maintained substantially its initial performance. The use of a regenerative redox couple allowed the photoelectrochemical behavior of the 3T device to be quantified without reverse biasing the semiconductor. In some embodiments, power metrics analysis on what potential and/or currents can be passed to attempt to optimize the night cycle such that over the course of an approximately 24-hour period that is a net gain in energy production, and the addition of a catalyst to the system for performing fuel-forming reactions like CO$_2$RR under diurnal lighting conditions may also be included.

In some embodiments, the 3T interdigitated back contact (IBC) Si solar cells may be fabricated by ISC Konstanz using a modified ZEBRA process. Hydrofluoric acid may be diluted to approximately 10% with water. The methyl viologen electrolyte solution may be prepared by dissolving methyl viologen (MV, approximately 98%, approximately 0.05 M) potassium hydrogen phthalate (KHP, approximately 99.95%, approximately 0.1 M), buffer solution, and potassium sulfate supporting electrolyte (approximately 99%, approximately 0.5 M). The pH of the MV solution was adjusted dropwise with concentrated hydrochloric acid (approximately 36.5-38%) until the pH was approximately 3.5.

In some embodiments, the 3T cells may be assembled into photoelectrodes by soldering to copper insulated wires with Sn/Pb solder to each of the bus bars on the back of the solar cell (each connected to the different doped material). The wires may be threaded through a glass tube with the solar cell mounted perpendicular to the glass tubing. The edges and back of the Si photoelectrode may be substantially covered with epoxy. The counter and reference electrodes may be made using carbon cloth connected directly to a Pt wire (approximately 99.9%), attached to a copper wire surrounded by glass, and epoxied in place to substantially minimize any direct contact between the electrolyte and the Pt wire.

In some embodiments, the p-Si (approximately 1.0072 Ω cm) and n$^+$-Si (approximately 0.001-0.003 W cm) controls may be prepared as photoelectrodes by cutting the Si into approximately 1 cm$^2$ pieces. The backside of the Si may be lightly scratched with a diamond scribe and GaIn eutectic may be applied to make ohmic contact. Tinned Cu wire may be coiled then pulled through an approximately 6 mm diameter glass tube, attached to the Si with a small amount of Ag past and epoxied in place. Electrode areas may be approximately 1.5-1.9 cm$^2$.

For photoelectrochemical characterization, the electrodes were arranged in a cylindrical four-port, ground-glass flask with a quartz bottom. A solar simulator was used as an illumination source with an incident illumination of approximately 86.7 mW cm$^{-2}$. The illumination on the electrochemical cell was adjusted using a Si photodiode calibrated to approximately 1 sun illumination.

For photoelectrochemical characterization, each Si photoelectrode was dipped in approximately 10% hydrofluoric acid for approximately 1 min to remove the native oxide layer, then quickly placed in the solution. Each test used approximately 30 mL of the buffered MV solution and was purged with N$_2$ for approximately 20 min prior to use. N$_2$ was purged throughout the test. Pre-electrolysis was performed using a carbon cloth working electrode, a platinum counter electrode behind a glass frit, and an Ag/AgCl reference electrode. For the pre-electrolysis, approximately −0.54 V vs. Ag/AgCl was applied to the large carbon cloth working electrode to build up the MV$^+$ species until the solution potential was approximately −0.5 V vs. Ag/AgCl as determined between the Ag/AgCl reference and an additional small carbon cloth reference electrode. The solution potential was kept between approximately −0.51 V and approximately −0.49 V vs. Ag/AgCl and was monitored with a multimeter. The solution was continuously stirred with a magnetic stir bar placed near the photoelectrode. The electrochemical techniques used were cyclic voltammetry (CV), chronoamperometry (CA), and chronopotentiometry (CP).

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A photoelectric device comprising:
a wafer having a first side and a second side;
a first n-type contact located on the first side;
a second n-type contact located on the second side; and
a p-type contact located on the second side; wherein:
the p-type contact and the second n-type contact are arranged in parallel,
the first n-type contact and the p-type contact are connected via a diode,
the diode is configured to allow a current to flow when the photoelectric device is exposed to a light source, and
the diode is configured to not allow a current to flow when the photoelectric device is not exposed to a light source.

2. The photoelectric device of claim 1, wherein:
the wafer comprises a crystalline Czochralski-grown n-type silicon (Si) wafer.

3. The photoelectric device of claim 1, wherein:
the first n-type contact comprises a diffused n+-Si front surface field.

4. The photoelectric device of claim 1, wherein:
the second n-type contact comprises a degeneratively doped Si region.

5. The photoelectric device of claim 1, wherein:
the p-type contact comprises a degeneratively doped Si region.

6. The photoelectric device of claim 1, wherein:
the second side comprises:
a Si oxide,
a Si nitride, and
a conductive metal.

7. The photoelectric device of claim 6, wherein:
the conductive metal comprises at least one of silver, copper, or gold.

8. A method of operating a photoelectric device, the method comprising:
operating the photoelectric device in a diode mode; and
operating the photoelectric device in an ohmic mode; wherein:
in the ohmic mode a current does not cross a diode, and
the photoelectric device comprises:
a wafer having a first side and a second side;
a first n-type contact located on the first side;
a second n-type contact located on the second side; and
a p-type contact located on the second side;
the p-type contact and the second n-type contact are arranged in parallel,
the first n-type contact and the p-type contact are connected via a diode,
the diode is configured to allow a current to flow when the photoelectric device is exposed to a light source, and
the diode is configured to not allow a current to flow when the photoelectric device is not exposed to a light source.

9. The method of claim 8, wherein:
the diode mode comprises connecting the first n-type contact and the p-type contact.

10. The method of claim 8, wherein:
the ohmic mode comprises connecting the first n-type contact with the second n-type contact.

11. The method of claim 8, wherein:
the diode comprises a semiconductor layer.

12. The method of claim 8, wherein:
the wafer comprises a crystalline Czochralski-grown n-type silicon (Si) wafer.

13. The method of claim 8, wherein:
the first n-type contact comprises a diffused n+-Si front surface field.

14. The method of claim 8, wherein:
the second n-type contact comprises a degeneratively doped Si region.

15. The method of claim 8, wherein:
the p-type contact comprises a degeneratively doped Si region.

16. The method of claim 8, wherein:
the second side comprises:
a Si oxide,
a Si nitride, and
a conductive metal.

17. The method of claim 16, wherein:
the conductive metal comprises at least one of silver, copper, or gold.

*     *     *     *     *